(12) United States Patent
Suzuki (10) Patent No.: US 8,600,078 B2
(45) Date of Patent: Dec. 3, 2013

(54) AUDIO SIGNAL AMPLITUDE ADJUSTING DEVICE AND METHOD

(75) Inventor: Yoshiki Suzuki, Kanagawa (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 663 days.

(21) Appl. No.: 12/819,240

(22) Filed: Jun. 21, 2010

(65) Prior Publication Data

US 2011/0002481 A1 Jan. 6, 2011

(30) Foreign Application Priority Data

Jul. 2, 2009 (JP) ................................ 2009-157523

(51) Int. Cl.
*H03G 3/00* (2006.01)

(52) U.S. Cl.
USPC .......................................... 381/107; 381/104

(58) Field of Classification Search
USPC ..................................... 381/104–107, 56–57
See application file for complete search history.

(56) References Cited

U.S. PATENT DOCUMENTS

| 8,199,933 | B2* | 6/2012 | Seefeldt ......................... | 381/104 |
| 2008/0008336 | A1* | 1/2008 | Tanaka et al. .................. | 381/104 |
| 2009/0274322 | A1* | 11/2009 | Chang et al. ................... | 381/107 |

FOREIGN PATENT DOCUMENTS

| JP | 01-309408 | 12/1989 |
| JP | 06-314942 | 11/1994 |
| JP | 09-130180 A | 5/1997 |
| JP | 11-214939 A | 8/1999 |
| JP | 2004-056660 A | 2/2004 |
| JP | 2004-104692 A | 4/2004 |

OTHER PUBLICATIONS

Japanese Notice of Rejection dated Apr. 30, 2013.

* cited by examiner

*Primary Examiner* — Disler Paul
(74) *Attorney, Agent, or Firm* — Volentine & Whitt, PLLC (57) ABSTRACT

An audio signal amplitude adjusting device and method that can always adjust the amplitude of an input audio signal to such a level as to be easy to hear with making it follow each shift in the level of the input audio signal, thus preventing the occurrence of the sense of aural discomfort and an interruption of a voice. The gain of a variable attenuator for adjusting the amplitude of the audio signal is controlled in various ways. When a momentary large noise sound is contained in the audio signal, the gain reduced state invoked to suppress the effect of the noise sound is detected, and thereafter if the amplitude of the audio signal has become smaller than the reference level due to the noise sound ending, the gain is increased each period that is shortest among the periods of control employed.

14 Claims, 6 Drawing Sheets

AUDIO SIGNAL AMPLITUDE ADJUSTING DEVICE AND METHOD

BACKGROUND OF THE INVENTION

1. Field of the Invention

The present invention relates to an audio signal amplitude adjusting device and method for automatically adjusting the amplitude of an input audio signal so as to be within a predetermined range and outputting the resultant signal.

2. Description of the Related Art

Presently, in recording apparatuses for recording audio signals from a microphone collecting voices, or apparatuses for performing various signal processing on audio signals, if the input audio signal is an analog audio signal, this signal is once converted by an A/D converter into a digital audio signal and then taken in. In this operation, if an analog audio signal having an amplitude beyond its input permissible range is input to the A/D converter, it is difficult to faithfully convert the signal into a digital audio signal.

Accordingly, an automatic amplitude control device has been proposed in which a variable attenuator for adjusting the amplitude of an input analog audio signal to be within the input permissible range of the A/D converter is provided at the stage in front of the A/D converter. Refer to, e.g., Japanese Patent Kokai No. H06-314942 (Patent Literature 1).

This automatic amplitude control device obtains the attenuation amount of the variable attenuator based on the level of the input analog audio signal and adjusts the amplitude of the analog audio signal by the attenuation amount. For example, when an analog audio signal having an amplitude over the upper limit of the input permissible range of the A/D converter is input, the attenuation amount is increased, thereby reducing the amplitude of the analog audio signal to be within the input permissible range, and thereafter when the amplitude of the input analog audio signal itself has shifted to within the input permissible range, the attenuation amount increased as mentioned above is reduced.

In the automatic amplitude control device, for the amplitude adjustment as described above, the response period from the increase in the attenuation amount to the audio signal amplitude going inside the input permissible range (called an attack time period) is made short. And the response period from when later the amplitude of the input audio signal itself has shifted to within the input permissible range to when the attenuation amount has been reduced to an original attenuation amount (called a recovery time period) is intentionally made long, thus avoiding the amplitude-adjusted audio signal becoming unnatural for the auditory sense.

SUMMARY OF THE INVENTION

However, when this automatic amplitude control device is mounted in a recording apparatus and a conversation of a plurality of people is recorded with a single microphone, a problem occurs that in the aforementioned recovery period, the operation of reduction in attenuation amount fails to follow shifts in voice level due to difference in voice volume between speakers or the positional relationship between the microphone and the speakers and that thus a voice is cut off temporarily. Also, when some single noise sound is made, the volume of conversation collected becomes small immediately after the noise sound ends, thus causing a temporary interruption of a voice.

According to an aspect of the present invention, there is provided an audio signal amplitude adjusting device and method that can always adjust the amplitude of an input audio signal to such a level as to be easy to hear with making it follow each shift in the level of the input audio signal, thus preventing the occurrence of the sense of aural discomfort and an interruption of a voice.

According to embodiments, there is provided an audio signal amplitude adjusting device for adjusting the amplitude of an input audio signal. The amplitude adjusting device comprises a variable attenuator that increases or attenuates the amplitude of the input audio signal according to a gain signal, thereby obtaining an amplitude-adjusted audio signal; and a gain control part that generates the gain signal based on the amplitude-adjusted audio signal. The gain control part comprises a regular recovery part that, if an envelope level of the amplitude-adjusted audio signal is lower than a predetermined reference level and higher than a predetermined minute audio level, generates a sequence of gain values where the gain value increases each predetermined first period, as the gain signal; a minute audio recovery part that, if the envelope level is lower than the minute audio level and higher than a predetermined noise level, generates a sequence of gain values where the gain value increases each second period, as the gain signal, the second period being shorter than the first period; a gain reduction recovery part that, if a shift from a state where the envelope level is higher than the reference level and a degree of decrease in the gain value indicated in the gain signal is higher than a predetermined degree of decrease to a state where the envelope level is lower than the reference level has occurred, generates a sequence of gain values where the gain value increases each third period, as the gain signal, the third period being shorter than the first period; and a noise gate part that, if the envelope level is lower than the noise level, generates a sequence of gain values where the gain value is constant, as the gain signal.

According to embodiments, there is provided an audio signal amplitude adjusting method for an amplitude adjusting device which comprises a variable attenuator that increases or attenuates the amplitude of an input audio signal according to a gain signal, thereby obtaining an amplitude-adjusted audio signal. The method comprises a regular recovery step of, if an envelope level of the amplitude-adjusted audio signal is lower than a predetermined reference level and higher than a predetermined minute audio level, generating a sequence of gain values where the gain value increases each predetermined first period, as the gain signal; a minute audio recovery step of, if the envelope level is lower than the minute audio level and higher than a predetermined noise level, generating a sequence of gain values where the gain value increases each second period, as the gain signal, the second period being shorter than the first period; a gain reduction recovery step of, if a shift from a state where the envelope level is higher than the reference level and a degree of decrease in the gain value indicated in the gain signal is higher than a predetermined degree of decrease to a state where the envelope level is lower than the reference level has occurred, generating a sequence of gain values where the gain value increases each third period, as the gain signal, the third period being shorter than the first period; and a noise gate step of, if the envelope level is lower than the noise level, generating a sequence of gain values where the gain value is constant, as the gain signal.

The gain of the variable attenuator for adjusting the amplitude of the audio signal is controlled as follows. If the amplitude of the audio signal is in the range of the reference level to the minute audio level, the gain is increased each first period, thereby increasing the gain relatively gently (regular recovery). By this means, an audio signal without causing the sense of aural discomfort is obtained. If the amplitude of the audio signal is greater than the noise level but smaller than the minute audio level, the gain is increased each second period that is shorter than the first period, thereby increasing the gain relatively quickly (minute audio recovery). By this means, immediately after the amplitude of the audio signal has changed from a relatively large level to the minute audio level or below, the gain is increased more quickly than in the regular recovery, thus preventing the interruption of voice. Thereafter, if the amplitude of the audio signal has become greater than the minute audio level, the regular recovery is performed, and hence an audio signal without causing the sense of aural discomfort is obtained. If the amplitude of the audio signal is smaller than the level of noise such as white noise, a constant low gain value is supplied to the variable attenuator, or the audio signal is muted, thereby cutting off noise (a noise gate). By this means, a good audio signal without white noise, which stands out when there is no sound, is obtained. When a momentary large noise sound is contained in the audio signal, the gain reduced state invoked to suppress the effect of the noise sound is detected, and thereafter if the amplitude of the audio signal has become smaller than the reference level due to the noise sound ending, the gain is increased each third period that is shorter than the first period, thereby increasing the gain relatively quickly (gain reduction recovery). By this means, immediately after the momentary noise sound ends, the amplitude of the audio signal can be increased to such a level as to be easy to hear.

DETAILED DESCRIPTION OF THE INVENTION

The gain of a variable attenuator for adjusting the amplitude of an audio signal is controlled as follows. If the amplitude of the audio signal is in the range of a reference level to a minute audio level, the gain is increased every first period. If the amplitude of the audio signal is greater than noise level and smaller than the minute audio level, the gain is increased every second period, the second period being shorter than the first period. If the amplitude of the audio signal is smaller than noise level, a constant low gain value is supplied to the variable attenuator, thereby cutting off noise. Furthermore, when a momentary large noise sound is contained in the audio signal, the gain reduced state invoked to suppress the effect of the noise sound is detected, and thereafter if due to the noise sound ending, the amplitude of the audio signal has become smaller than the reference level, the gain is increased every third period, the third period being shorter than the first period.

Figure 1:
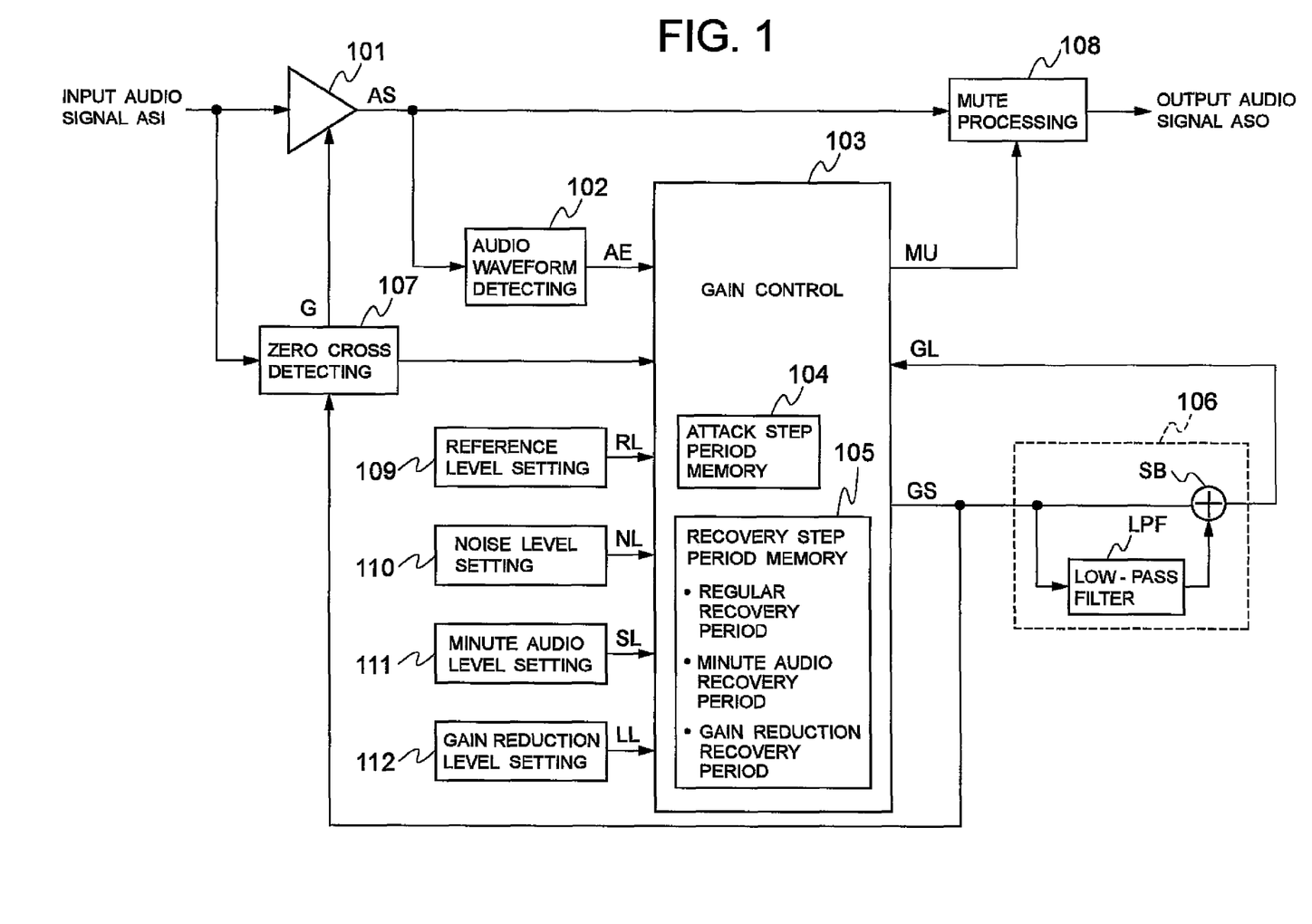
FIG. 1 is a diagram showing an example of the configuration of an audio signal amplitude adjusting device according to the present invention.

FIG. 1 is a diagram showing an example of the configuration of an audio signal amplitude adjusting device according to the present invention.

The amplitude adjusting device shown in FIG. 1 comprises a variable attenuator 101, an audio waveform detecting part 102, a gain control part 103, a gain reduction detecting part 106, a zero cross detecting part 107, a mute processing part 108, a reference level setting part 109, a noise level setting part 110, a minute audio level setting part 111, and a gain reduction level setting part 112.

The variable attenuator 101 is a volume adjuster comprising, for example, a variable gain amplifier. The variable attenuator 101 supplies an amplitude-adjusted audio signal obtained by increasing or attenuating the amplitude of an input audio signal ASI with the gain (in the range of, e.g., −12 dB to +35 dB) indicated by a gain signal G supplied from the zero cross detecting part 107, as an audio signal AS to the audio waveform detecting part 102 and the mute processing part 108.

The audio waveform detecting part 102 generates an envelope waveform from the audio signal AS and supplies an audio envelope signal AE representing the envelope waveform to the gain control part 103.

The gain reduction detecting part 106 comprises a low-pass filter LPF and a subtractor SB. The low-pass filter LPF extracts low frequency components of a predetermined frequency and below, e.g. 1 to 2 Hz and below, from a gain signal GS supplied from the gain control part 103 that represents a sequence of gain values to be set in the variable attenuator 101 and supplies them to the subtractor SB. The subtractor SB subtracts the low frequency components from the gain signal GS and supplies the subtraction result as a gain reduction detection signal GL to the gain control part 103. By this means, if the gain signal GS formed of a sequence of the same gain values is supplied, the gain reduction detecting part 106 produces the gain reduction detection signal GL of a level "0". But if detecting that in the sequence of gain values represented by the gain signal GS, the gain value rapidly decreases at a rate larger than a predetermined decrease rate, the gain reduction detecting part 106 produces the gain reduction detection signal GL having a level of negative polarity corresponding to the degree of decrease.

The zero cross detecting part 107 detects the time when the level of the input audio signal ASI has shifted from a level below the center level of the amplitude to the center level or from a level above the center level of the amplitude to the center level, as a zero cross time point. Here, only at this zero cross time point, the zero cross detecting part 107 supplies the gain signal GS supplied from the gain control part 103, as it is, as the aforementioned gain signal G to the variable attenuator 101. That is, only at the zero cross time point when the level of the input audio signal ASI is at the center level of the amplitude, the gain of the variable attenuator 101 changes to the gain value indicated by the gain signal GS. By this means, noise occurring at the gain change is reduced. Note that the zero cross detecting part 107 is configured such that it can be arbitrarily set whether the change operation for the gain value is valid or invalid. That is, only when the change operation is set valid, the zero cross detecting part 107 supplies the gain signal GS supplied from the gain control part 103, as it is, as the gain signal G to the variable attenuator 101, thereby changing the gain of the variable attenuator 101. On the other hand, when set invalid, the zero cross detecting part 107 continues to supply the variable attenuator 101 with the gain signal G that was supplied to the variable attenuator 101 just before. Namely, the gain of the variable attenuator 101 is not changed.

When a mute instruction signal MU is supplied from the gain control part 103, the mute processing part 108 performs mute processing on the audio signal AS to reduce its audio level to a predetermined minute level and outputs the obtained signal as an output audio signal ASO. When the mute instruction signal MU is not supplied, the mute processing part 108 outputs the audio signal AS, as it is, as the output audio signal ASO.

In the reference level setting part 109, a reference level RL is set (stored) as a threshold that is a reference in maintaining the amplitude of the amplitude-adjusted audio signal at a predetermined constant amplitude. The reference level setting part 109 supplies this reference level RL to the gain control part 103.

In the noise level setting part 110, a noise level NL is set (stored) as a threshold that serves as a trigger to start a noise gate function (described later). The noise level setting part 110 supplies this noise level NL to the gain control part 103.

In the minute audio level setting part 111, a minute audio level SL is set (stored) as a lower limit in increasing the audio level to be recovered in a recovery mode (described later). The minute audio level setting part 111 supplies this minute audio level SL to the gain control part 103.

In the gain reduction level setting part 112, a gain reduction level LL is set (stored) as a threshold in selecting which mode of a regular recovery mode (described later) and a gain reduction recovery mode (described later) to be executed. The gain reduction level setting part 112 supplies this gain reduction level LL to the gain control part 103.

Note that the reference level setting part 109, the noise level setting part 110, the minute audio level setting part 111, and the gain reduction level setting part 112, according to the input operation of a user, take in the reference level RL, the noise level NL, the minute audio level SL, and the gain reduction level LL respectively to be set therein as described above.

The gain control part 103 comprises an attack step period memory 104 and a recovery step period memory 105 to store an attack step period and recovery step periods respectively. Here, the attack step period is a time per step when the gain control part 103 decreases the gain of the variable attenuator 101 by, e.g., 0.5 dB each step so as to reduce the amplitude of the audio signal AS in response to a rapid increase in that amplitude. The recovery step period is a time per step when the gain control part 103 increases the gain of the variable attenuator 101 by 0.5 dB each step so as to increase the amplitude of the audio signal in the case where the gain reduction control of the variable attenuator 101 is performed because the input audio signal ASI has increased and where thereafter the amplitude of the input audio signal ASI has decreased. Note that the recovery step period for the regular recovery mode (called a regular recovery period), the recovery step period for a minute audio recovery mode (called a minute audio recovery period), and the recovery step period for the gain reduction recovery mode (called a gain reduction recovery period) are separately stored in the recovery step period memory 105. The attack step period memory 104 and the recovery step period memory 105 are configured such that the attack step period and the various recovery step periods can be set (stored) therein by external input respectively.

Further, the gain control part 103 has the noise gate function to cut off the output of this noise sound when the sound denoted by the input audio signal ASI contains only a noise sound of minute volume such as white noise. Here, it can be arbitrarily set whether the noise gate function is valid or invalid. Further, where the noise gate function is set valid, it can be arbitrarily selected whether the noise gate function is performed by the mute processing part 108 (a mute gate mode) or the variable attenuator 101 (a gain attenuation gate mode). The gain control part 103 makes the noise gate function described below start only if the noise gate function is set valid. That is, during the time period when the level of the audio envelope signal AE is smaller at each time point than the noise level NL, the gain control part 103 makes the noise gate function operate. For example, if the mute gate mode is selected, the gain control part 103 supplies a mute instruction signal MU to perform mute processing on the audio signal AS to the mute processing part 108. If the gain attenuation gate mode is selected, the gain control part 103 supplies the gain signal GS formed of a sequence of the same low gain values over the above time period to the variable attenuator 101 via the zero cross detecting part 107. Hence, if the input audio signal ASI has a time period during which only a noise sound of minute volume exists, the noise gate function is made to operate, thereby outputting the output audio signal ASO having the noise sound reduced in level or removed over the time period.

Furthermore, based on the result of comparing the level at each time point of the audio envelope signal AE with the reference level RL, the gain control part 103 selects which mode of the following gain control modes for the variable attenuator 101 to execute:

an attack mode,
a recovery mode, and
a gain fixed mode.

Here, the recovery mode refers collectively to the regular recovery mode, the minute audio recovery mode (described later), and the gain reduction recovery mode.

Then, the gain control part 103 performs processing (described later) corresponding to the selected mode, thereby obtaining gain values to be set in the variable attenuator 101 and supplying the gain signal GS formed of a sequence of the gain values to the zero cross detecting part 107.

The operation of the amplitude adjusting device shown in FIG. 1 will be described below.

Figure 2:
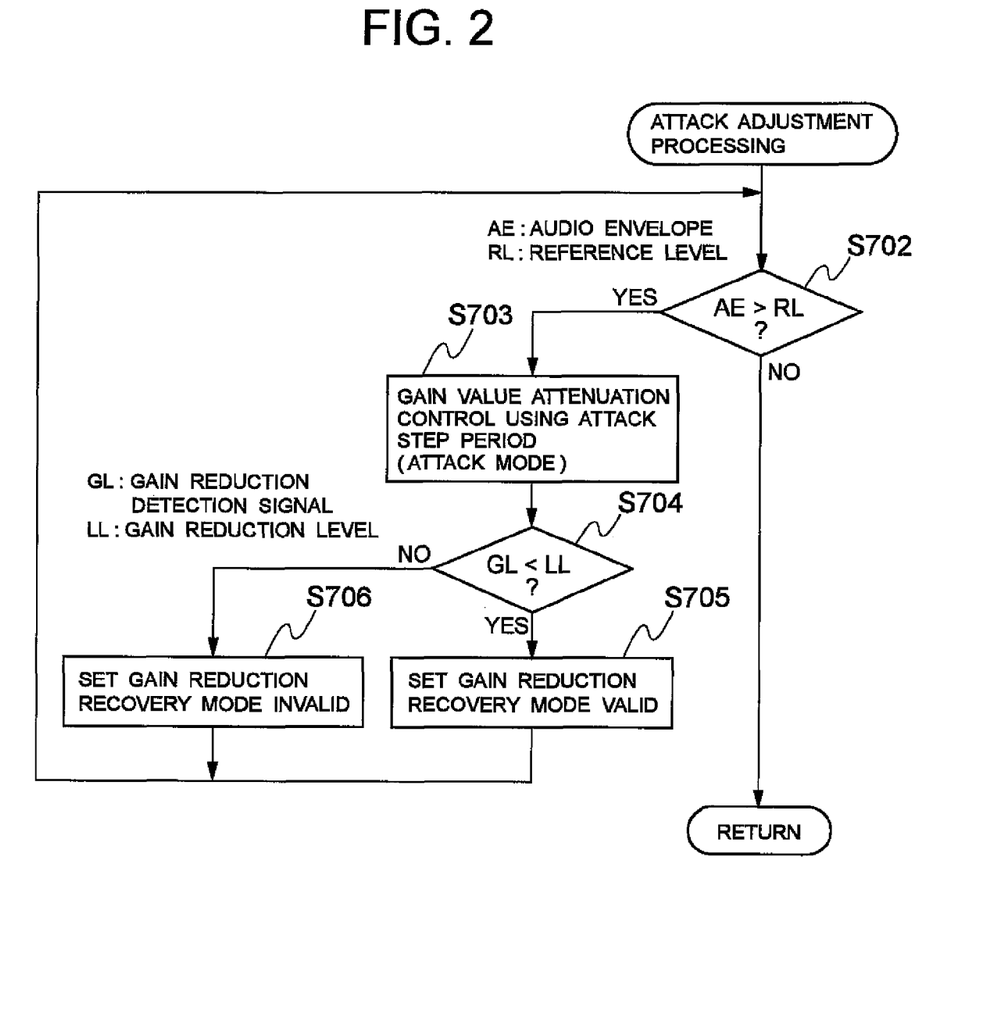
FIG. 2 shows an attack adjustment processing flow.
Figure 3:
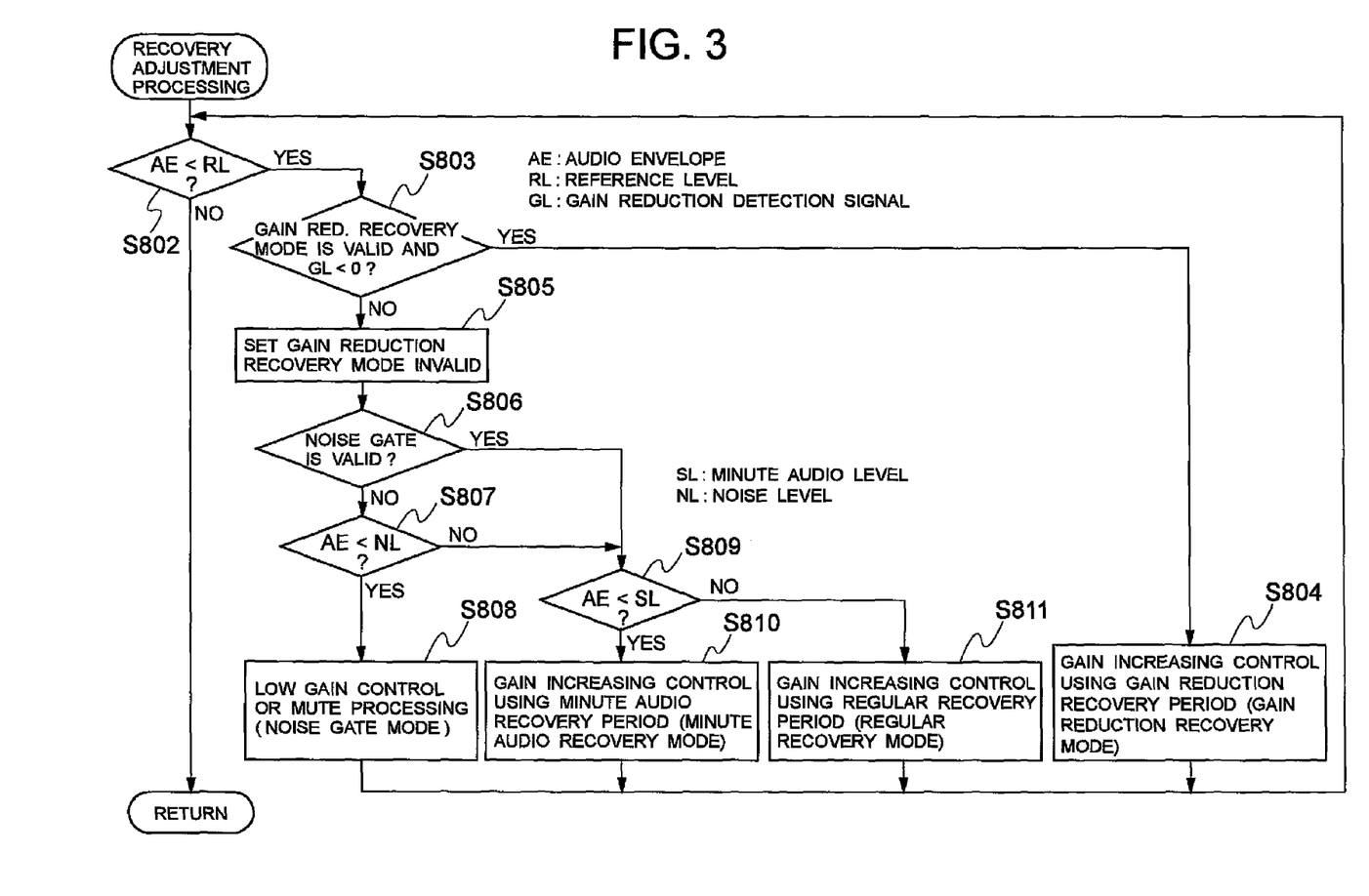
FIG. 3 shows a recovery adjustment processing flow.

The gain control part 103 performs processing according to an attack adjustment processing flow as shown in FIG. 2 and processing according to a recovery adjustment processing flow as shown in FIG. 3 sequentially and repeatedly each predetermined period.

Figure 4:
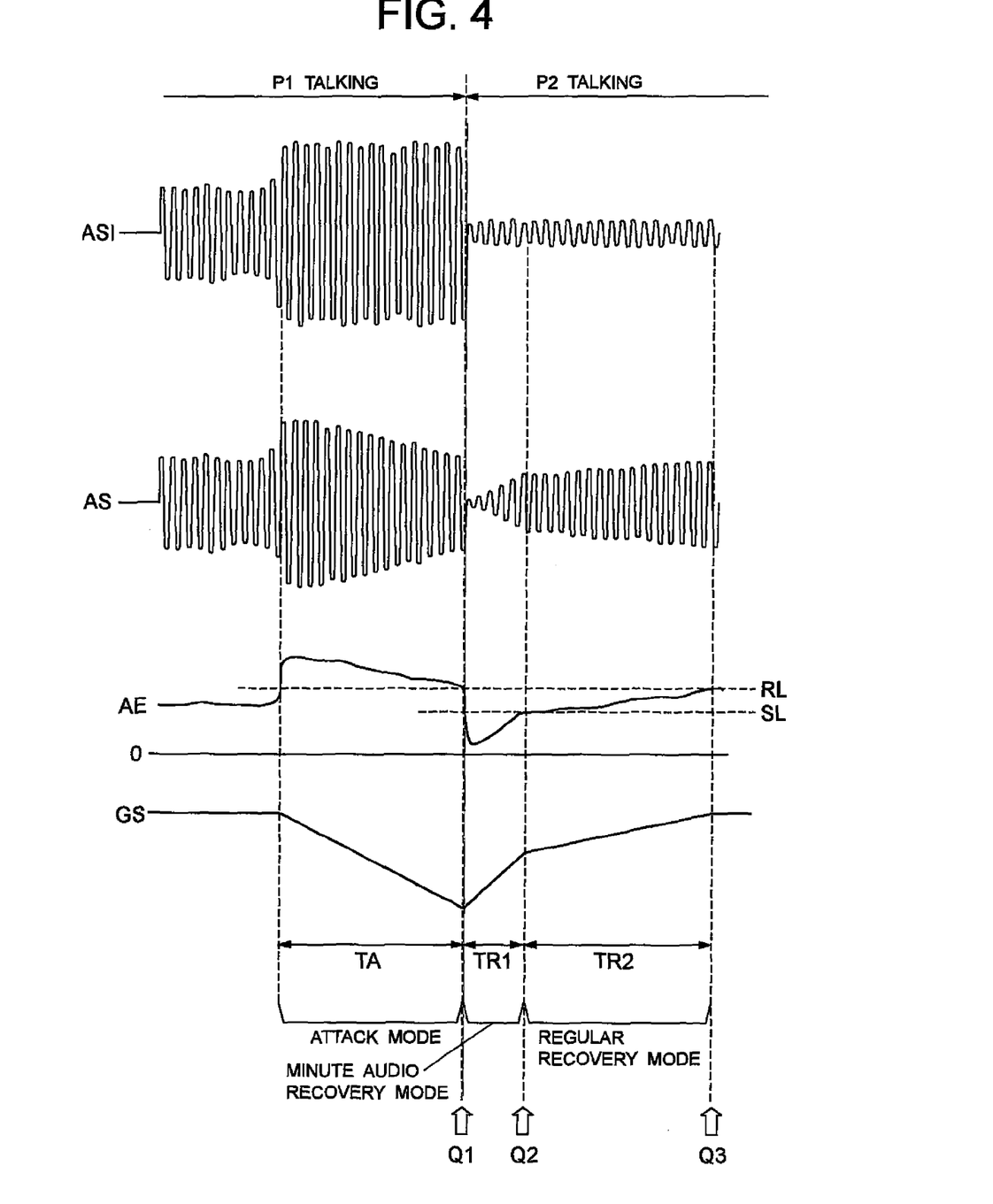
FIG. 4 is a diagram showing an example of the amplitude adjusting operation in each of an attack mode, a minute audio recovery mode, and a regular recovery mode.

In the attack adjustment processing flow shown in FIG. 2, the gain control part 103 determines whether the audio envelope signal AE supplied from the audio waveform detecting part 102 is greater than or equal to the reference level RL shown in FIG. 4 (step S702). If at step S702 it is determined that the audio envelope signal AE is greater than or equal to the reference level RL, the gain control part 103 performs step S703 below to be in the attack mode, where attenuation control is performed on the variable attenuator 101 over an attack time period TA shown in FIG. 4.

That is, first, the gain control part 103 reads the attack step period stored in the attack step period memory 104 and decreases the current gain value indicated in the gain signal GS by 0.5 dB each attack step period, thus stepwise (step S703). By this means, in the attack time period TA shown in FIG. 4, the gain value indicated in the gain signal GS gradually decreases, and accordingly the amplitude of the audio signal AS output from the variable attenuator 101 also decreases as shown in FIG. 4. During this time, the gain control part 103 determines whether the level of the gain reduction detection signal GL supplied from the gain reduction detecting part 106 has become lower than the gain reduction level LL set in the gain reduction level setting part 112 (step S704). If at step S704 it is determined that the gain reduction detection signal GL has become lower than the gain reduction level LL, the gain control part 103 stores a value indicating the gain reduction recovery mode being valid in an inner flag register (not shown) so as to make the gain reduction recovery mode valid (step S705). Note that this step S705 is performed at abnormal input such as when a steep noise sound of large volume is contained in the input audio signal ASI. If at step S704 it is determined that the gain reduction detection signal GL has not become lower than the gain reduction level LL, the gain control part 103 stores a value indicating the gain reduction recovery mode being invalid in the inner flag register (step S706). After executing the step S705 or the step S706, the gain control part 103 returns to the execution of the above step S702 and repeats the operation described above.

As shown in FIG. 4, the amplitude of the audio signal AS having decreased, if at the step S702 it is determined that the audio envelope signal AE is not greater than or equal to the reference level RL, the gain control part 103 exits the attack adjustment processing flow shown in FIG. 2 and enters the recovery adjustment processing flow shown in FIG. 3.

In FIG. 3, first the gain control part 103 determines whether the audio envelope signal AE is lower than or equal to the reference level RL shown in FIG. 4 (step S802). If at the step S802 it is determined that the audio envelope signal AE is lower than or equal to the reference level RL, the gain control part 103 determines whether the value of the inner flag register indicates the gain reduction recovery mode being valid and whether the gain reduction detection signal GL has a value of negative polarity indicating a rapidly decreasing trend of the gain value (step S803).

If at step S803 it is determined that the gain reduction recovery mode is valid and that the gain reduction detection signal GL has a value of negative polarity indicating a decreasing trend of the gain value, the gain control part 103 determines that rapid gain reduction control associated with abnormal input such as an occurrence of noise is being performed and starts executing the gain reduction recovery mode at step S804 as described below.

That is, the gain control part 103 reads the gain reduction recovery period stored in the recovery step period memory 105 and increases the current gain value indicated in the gain signal GS by 0.5 dB each gain reduction recovery period, thus stepwise (step S804). By performing the gain reduction recovery mode, the gain value indicated in the gain signal GS gradually increases, and accordingly the amplitude of the audio signal AS output from the variable attenuator 101 also increases. After executing step S804, the gain control part 103 returns to the execution of the above step S802 and repeats the operation described above. On the other hand, if at step S803 it is determined that the gain reduction detection signal GL does not have a value of negative polarity indicating a rapidly decreasing trend of the gain value, the gain control part 103 overwrites the content of the inner flag register with a value indicating the gain reduction recovery mode being invalid (step S805). Then, the gain control part 103 determines whether the noise gate function is set "valid" (step S806).

If at step S806 it is determined that the noise gate function is set "valid", the gain control part 103 determines whether the audio envelope signal AE is lower than or equal to the noise level NL supplied from the noise level setting part 110 (step S807). If at the step S807 it is determined that the audio envelope signal AE is lower than or equal to the noise level NL, that is, if the sound denoted by the input audio signal ASI contains only a white noise sound of minute volume, the gain control part 103 performs noise gate processing to remove this noise sound (step S808). That is, at step S808, when the mute gate mode is selected for the noise gate function, the gain control part 103 supplies the mute instruction signal MU to perform mute processing on the audio signal AS to the mute processing part 108. When the gain attenuation gate mode is selected for the noise gate function, the gain control part 103 supplies the gain signal GS formed of a sequence of predetermined extremely low gain values to the variable attenuator 101 via the zero cross detecting part 107. If the input audio signal ASI has a time period during which a white noise sound of minute volume exists, by performing step S808, the output audio signal ASO having the noise sound reduced in level or removed over the time period is output. After executing step S808, the gain control part 103 returns to the execution of the above step S802 and repeats the operation described above. That is, the noise gate function as described above is made to continue operating until it is determined at the step S802 that the audio envelope signal AE is greater than or equal to the reference level RL or until it is determined at the step S807 that the audio envelope signal AE is greater than or equal to the noise level NL.

If it is determined at the step S807 that the audio envelope signal AE is greater than or equal to the noise level NL, or if it is determined at the step S806 that the noise gate function is set "invalid", then the gain control part 103 determines whether the audio envelope signal AE is lower than or equal to the minute audio level SL supplied from the minute audio level setting part 111 (step S809). For example, the gain control part 103 determines whether the audio envelope signal AE is lower than or equal to the minute audio level SL shown in FIG. 4. If at step S809 it is determined that the audio envelope signal AE is lower than or equal to the minute audio level SL, then at, e.g., time point Q1 shown in FIG. 4, the gain control part 103 starts executing the minute audio recovery mode at step S810 as described below.

That is, the gain control part 103 reads the minute audio recovery period stored in the recovery step period memory 105 and increases the current gain value indicated in the gain signal GS by 0.5 dB each minute audio recovery period, thus stepwise (step S810). Here, the minute audio recovery period is shorter than the regular recovery period in the regular recovery mode. Hence, by performing the minute audio recovery mode, over a first recovery time period TR1 shown in FIG. 4, the gain value indicated in the gain signal GS increases at a rate greater than the rate at which the gain value changes over time in a second recovery time period TR2 described later, and accordingly the amplitude of the audio signal AS output from the variable attenuator 101 also increases as shown in FIG. 4.

After executing the minute audio recovery mode at the step S810, the gain control part 103 returns to the execution of the above step S802 and repeats the operation described above. That is, the minute audio recovery mode as described above continues to be performed until it is determined at the step S802 that the audio envelope signal AE is greater than or equal to the reference level RL or until it is determined at the step S809 that the audio envelope signal AE is greater than or equal to the minute audio level SL.

Here, when it is determined at the step S809 that the audio envelope signal AE is greater than or equal to the minute audio level SL, then at, e.g., time point Q2 shown in FIG. 4, the gain control part 103 starts executing the regular recovery mode at step S811 as described below.

That is, the gain control part 103 reads the regular recovery period stored in the recovery step period memory 105 and increases the current gain value indicated in the gain signal GS by 0.5 dB each regular recovery period, thus stepwise (step S811). Here, the regular recovery period is longer than the minute audio recovery period in the minute audio recovery mode. Hence, by performing the regular recovery mode, over the second recovery time period TR2 shown in FIG. 4, the gain value indicated in the gain signal GS increases at a rate smaller than the rate at which the gain value changes over time in the first recovery time period TR1, and accordingly the amplitude of the audio signal AS output from the variable attenuator 101 also gently increases as shown in FIG. 4.

After executing the regular recovery mode at the step S811, the gain control part 103 returns to the execution of the above step S802 and repeats the operation described above. That is, the regular recovery mode as described above continues to be performed until it is determined at the step S802 that the audio envelope signal AE is greater than or equal to the reference level RL.

Here, when it is determined at the step S802 that the audio envelope signal AE is greater than or equal to the reference level RL, then at, e.g., time point Q3 shown in FIG. 4, the gain control part 103 finishes the process that follows the recovery adjustment processing flow shown in FIG. 3.

Figure 5:
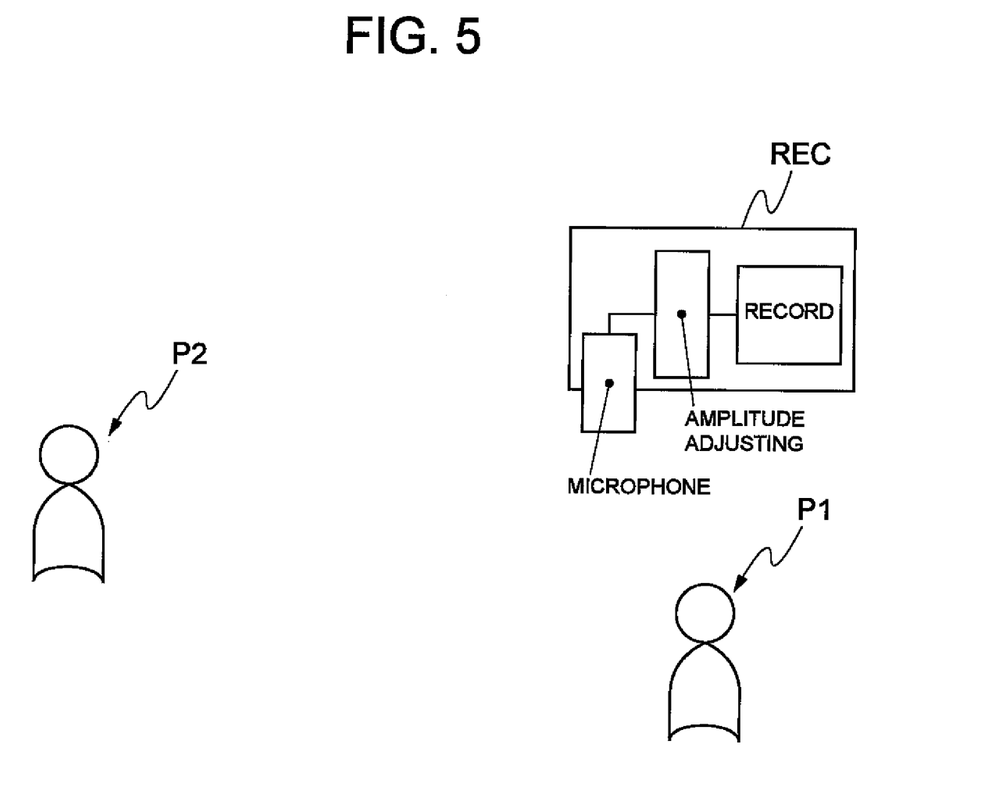
FIG. 5 shows a set-up situation for explaining the operation of the amplitude adjusting device according to the present invention.

The operation of the amplitude adjusting device described above will be described below taking as an example the case where a recording apparatus REC having the amplitude adjusting device mounted therein is placed between two speakers P1 and P2 to record their conversation as shown in FIG. 5. Here, the recording apparatus REC records audio signals obtained by its built-in microphone collecting voices onto a record medium via this amplitude adjusting device. In the set-up situation shown in FIG. 5, the distance from the recording apparatus REC to the speaker P2 is larger than the distance from the recording apparatus REC to the speaker P1.

Here, it is assumed that various setting values are already set in the amplitude adjusting device, for example, as follows:
reference level RL: −6 dB,
noise level NL: −60 dB,
minute audio level SL: −30 dB,
regular recovery period: 83 msec, and
minute audio recovery period: 10 msec.

That is, the reference level RL of −6 dB is a threshold determined taking into account the dynamic range in recording. The noise level NL of −60 dB is a threshold used to determine a minute sound that need not be recorded to be a noise sound such as white noise. The minute audio level SL of −30 dB is such a threshold that voices of minute levels that need to be recorded are increased (recovered) in level by the variable attenuator 101 to, at least, a level greater than or equal to this minute audio level SL. The regular recovery period of 83 msec is a period of time calculated from the recovery time period, which it should take for the variable attenuator 101 to increase the level of the audio signal AS from the minute audio level SL (−30 dB) to the reference level RL (−6 dB), being set at 4 sec considering voice modulation. Namely, where the gain is increased by 0.5 dB each step in order to increase the level of the audio signal AS from the level of −30 dB to the level of −6 dB, 48 steps of gain changes are necessary as shown in the following equation:

$$48=[-6\ dB-(-30\ dB)]/0.5\ dB.$$

Thus, for the recovery time period of 4 sec, gain change time per step, i.e., the recovery step period is about 83 msec.

As such, the reference level RL, minute audio level SL, and noise level NL that have a magnitude relation of reference level RL>minute audio level SL>noise level NL are set in the reference level setting part 109, the noise level setting part 110, and the minute audio level setting part 111, respectively.

The minute audio recovery period of 10 msec is about 1/8 of the regular recovery period of 83 msec. For example, it takes 60 steps of gain changes as shown in the following equation to attenuate the audio signal AS from the minute audio level SL of −30 dB to the noise level NL of −60 dB using the minute audio recovery period:

$$60=[-30\ dB-(-60\ dB)]/0.5\ dB.$$

Hence, it takes 60×10 msec=0.6 sec to attenuate the audio signal AS from the minute audio level SL of −30 dB to the noise level NL of −60 dB using the minute audio recovery period.

<Minute Audio Recovery Mode-Regular Recovery Mode Operation>

In the situation shown in FIG. 5, the speaker P1 starts talking. Then, the amplitude adjusting device mounted in the recording apparatus REC starts automatic amplitude adjusting control for the voice of the speaker P1. At this time, if it is determined at step S702 of FIG. 2 that the audio envelope signal AE corresponding to the voice of the speaker P1 is greater than or equal to the reference level RL (−6 dB), the attack mode is executed according to the attack adjustment processing flow shown in FIG. 2 (step S703). That is, the gain control to attenuate the gain level continues to be performed on the variable attenuator 101 until the audio envelope signal AE corresponding to the voice of the speaker P1 becomes smaller than the reference level RL as shown in the attack time period TA in FIG. 4.

Here, when the speaker P1 stops talking and subsequently the speaker P2 starts talking, the amplitude adjusting device starts the following automatic amplitude adjusting control.

The distance between the speaker P2 and the recording apparatus REC is larger than the distance between the speaker P1 and the recording apparatus REC. Hence, the level of the audio envelope signal AE corresponding to the voice of the speaker P2 is likely to be such a minute level that voice is hard to hear. Accordingly, if the audio envelope signal AE is lower than or equal to the minute audio level SL (−30 dB), the amplitude adjusting device starts executing the minute audio recovery mode at, e.g., time point Q1 shown in FIG. 4 to quickly increase the amplitude of the audio signal AS corresponding to the voice of the speaker P2 (step S810). In the minute audio recovery mode, the gain of the variable attenuator 101 is increased by 0.5 dB each minute audio recovery period (10 msec), which is shorter than the regular recovery period (83 msec), (in the first recovery time period TR1). Thus, even when the speaker P1, whose voice level is so large that the variable attenuator 101 performs attenuation control, stops talking and subsequently the speaker P2, whose voice level is a minute level, starts talking, the amplitude of the audio signal AS is quickly increased to the level SL (−30 dB) at which the voice of the speaker P2 can be heard. When due to the increase in the amplitude of the audio signal AS, the level of the audio envelope signal AE corresponding to the voice of the speaker P2 becomes greater than the minute audio level SL (−30 dB), the amplitude adjusting device starts executing the regular recovery mode at, e.g., time point Q2 shown in FIG. 4 (step S811). In the regular recovery mode, the gain of the variable attenuator 101 is increased by 0.5 dB each regular recovery period (83 msec), which is longer than the minute audio recovery period (10 msec), (in the second recovery time period TR2). Hence, the amplitude of the audio signal AS corresponding to the voice of the speaker P2 is increased by the variable attenuator 101 gradually so as to prevent the occurrence of the sense of aural discomfort, to such a level as to be easy to hear, that is, the reference level RL (−6 dB).

Thereafter, that is, at time point Q3 and later shown in FIG. 4, if the audio signal AS corresponding to the voice of the speaker P2 has no large change, gain control to maintain the audio envelope signal AE corresponding to the voice of the speaker P2 at the reference level RL (−6 dB) is performed by the gain control part 103 as described above. That is, the control to attenuate the gain each attack step period in the attack mode (S703) and the control to increase the gain each regular recovery period in the regular recovery mode (S811) are alternately performed.

<Gain Reduction Recovery Mode-Regular Recovery Mode Operation>

When, for example, a heavy object falls from a table to make an impulsive sound while the speaker P1 or P2 is talking, the built-in microphone of the recording apparatus REC collects this momentary impulsive sound as well. Accordingly, the audio envelope signal AE becomes greater than or equal to the reference level RL, and hence the attack mode (S703) is executed. Consequently, the gain of the variable attenuator 101 is sharply reduced temporarily. Subsequently, in order to make the gain of the variable attenuator 101 return to an appropriate gain, the gain increasing control in the recovery mode is executed. Hence, the amplitude of the audio signal AS corresponding to the voice of the speaker P1 or P2 is reduced in the period from the reduction in the gain of the variable attenuator 101 to the gain returning to an appropriate gain, and thus the conversation is cut off temporarily. Hence, when such a momentary noise sound of large volume has occurred, the gain increasing control to quickly increase the gain of the variable attenuator 101 needs to be executed.

Accordingly, the amplitude adjusting device is provided with the gain reduction detecting part 106 to detect a momentary noise sound of large volume as mentioned above. By detecting the sharp gain-reduction operation of the gain control part 103 following the occurrence of a momentary noise sound of large volume, it is detected that a momentary noise sound of large volume has occurred.

Figure 6:
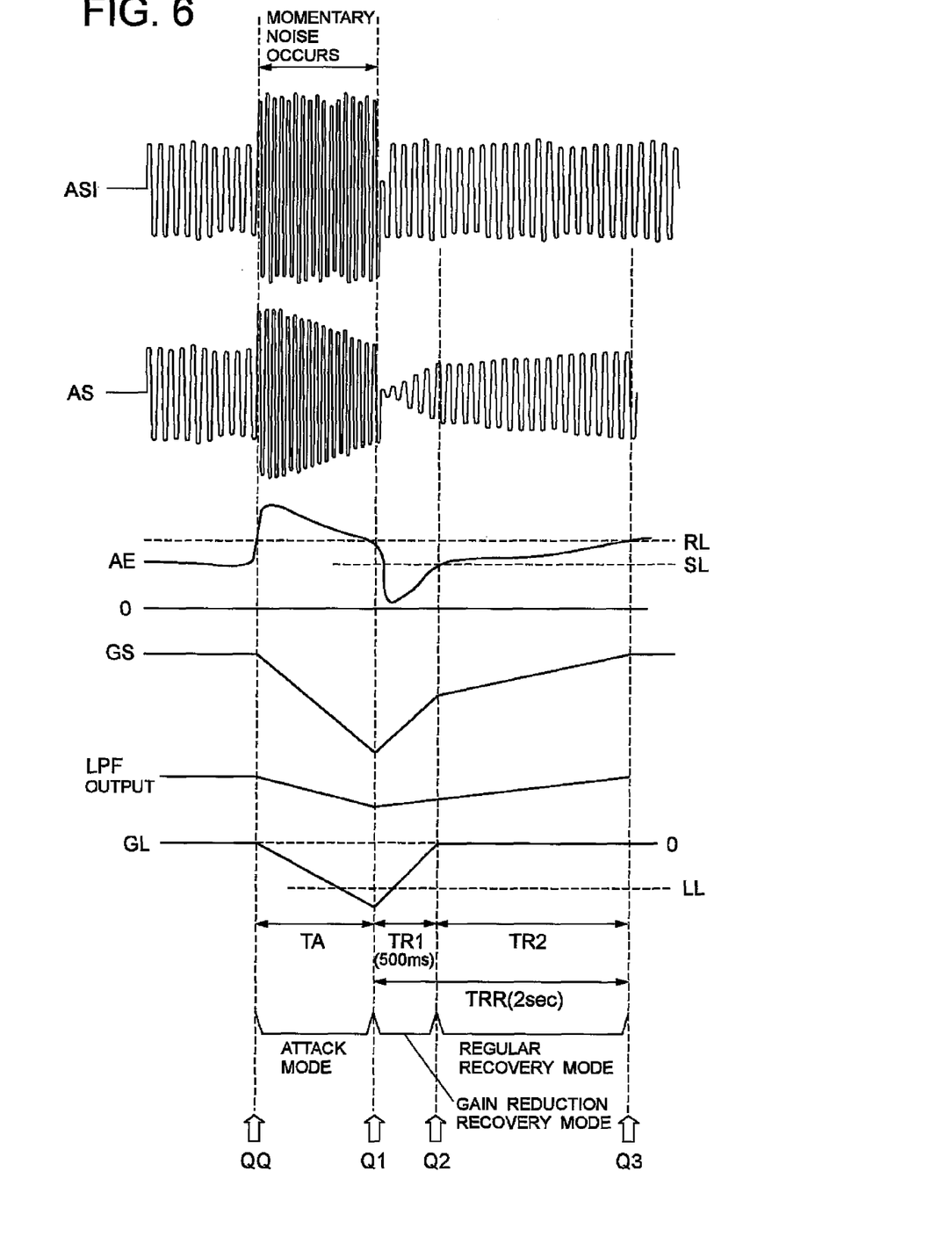
FIG. 6 is a diagram showing an example of the amplitude adjusting operation in each of the attack mode, a gain reduction recovery mode, and the regular recovery mode.

For example, it is assumed that because a momentary noise sound of large volume is contained in the audio signal AS, the gain signal GS sent from the gain control part 103 starts sharply decreasing at time point QQ in FIG. 6. Then, the level of the signal GL output from the gain reduction detecting part 106 gradually decreases from the state of zero to have a value of negative polarity from time point QQ on in FIG. 6. Further, since the gain signal GS has sharply decreased, its value becomes smaller than the gain reduction level LL as shown in FIG. 6. Hence, a value indicating the gain reduction recovery mode being valid is stored in the inner flag register (S705), and the gain reduction recovery mode is performed (S804). In the gain reduction recovery mode, the gain of the variable attenuator 101 is increased by 0.5 dB each gain reduction recovery period, which is shorter than the regular recovery period (83 msec). Here, it is assumed that the rapid gain reduction is 24 steps worth (12 dB) of reduction, the 24 steps being about ¼ of a total of 95 steps as the gain setting step number of the variable attenuator 101. Then, if 24 steps worth of gain increasing control is performed using the regular recovery period (83 msec) to make the reduced gain recover to the original gain value, a recovery time period of about two seconds will be needed as shown in FIG. 6. Here, if during the first 500 msec (the first recovery time period TR1 in FIG. 6) of the two seconds, the fast recovery is performed where the gain is increased by 0.5 dB each gain reduction recovery period, a low-pass filter LPF having a cut-off frequency of 1/500 msec, i.e., 2 Hz is necessary.

As such, if a momentary noise sound of large volume occurs in conversation, after rapidly decreasing the gain of the variable attenuator 101 to reduce the amplitude of the audio signal AS corresponding to this noise sound, the gain reduction recovery mode is performed, thereby making the gain quickly increase. With this operation, it is possible to increase the amplitude of the audio signal AS corresponding to the voice of a speaker to such a level as to be easy to hear immediately after the momentary noise sound ends.

As described above, the amplitude adjusting device for an audio signal according to an embodiment of the present invention is configured such that the gain of the variable attenuator (101) for adjusting the amplitude of the audio signal is controlled as follows. If the amplitude of the audio signal is in the range of the reference level (RL) to the minute audio level (SL), the gain is increased each first period (regular recovery period) (S811). If the amplitude of the audio signal is greater than the noise level (NL) but smaller than the minute audio level, the gain is increased each second period (minute audio recovery period) that is shorter than the first period (S810). If the amplitude of the audio signal is smaller than the noise level, a constant low gain value is supplied to the variable attenuator, thereby cutting off noise (S808). When a momentary large noise sound is contained in the audio signal, the gain reduced state invoked to suppress the effect of the noise sound is detected (106, S704 to S706), and thereafter if the amplitude of the audio signal has become smaller than the reference level due to the noise sound ending, the gain is increased each third period (gain reduction recovery period) that is shorter than the first period (S804).

With this configuration, with removing minute noise such as white noise, which stands out when there is no sound, and with preventing the interruption of voice from occurring immediately after the amplitude of the audio signal changes from being large to being smaller than the minute audio level, or immediately after a momentary large noise sound occurs and ends, the amplitude of the input audio signal can be adjusted to such a level as to be easy to hear naturally for the auditory sense.

This application is based on Japanese Patent Application No. 2009-157523 which is herein incorporated by reference.

What is claimed is:

1. An audio signal amplitude adjusting device for adjusting the amplitude of an input audio signal, comprising:
    a variable attenuator that increases or attenuates the amplitude of said input audio signal according to a gain signal, thereby obtaining an amplitude-adjusted audio signal; and
    a gain control part that generates said gain signal constituted by a series of gain values, based on a result of comparison between a level of said amplitude-adjusted audio signal and a predetermined reference level,
    wherein said gain control part comprises:
    a regular recovery part that, if the sequence of the gain values indicated by said gain signal is not in a decreasing trend or is in the decreasing trend but a decreasing degree is lower than a predetermined gain reduction level, and an envelope level of said amplitude-adjusted audio signal is lower than said predetermined reference level and higher than a predetermined minute audio level, changes the sequence of the gain values of said gain signal to a sequence of gain values where the gain value increases each predetermined first period, as said gain signal;
    a minute audio recovery part that, if the sequence of the gain values indicated by said gain signal is not in the decreasing trend or is in the decreasing trend but the decreasing degree is lower than the predetermined gain reduction level, and said envelope level is lower than said minute audio level and higher than a predetermined noise level, changes the sequence of the gain values of said gain signal to a sequence of gain values where the gain value increases each second period, as said gain signal, the second period being shorter than said first period;

a gain reduction recovery part that, if the sequence of the gain values indicated by said gain signal is in the decreasing trend and the decreasing degree is higher than the predetermined gain reduction level, and a shift from a state where said envelope level is higher than said reference level to a state where said envelope level is lower than said reference level has occurred, changes the sequence of the gain values of said gain signal to a sequence of gain values where the gain value increases each third period, as said gain signal, the third period being shorter than said first period; and a noise gate part that, if the sequence of the gain values indicated by said gain signal is not in the decreasing trend or is in the decreasing trend but the decreasing degree is lower than the predetermined gain reduction level, and said envelope level is lower than said noise level, changes the sequence of the gain values of said gain signal to a sequence of gain values where the gain value is constant, as said gain signal.

2. An audio signal amplitude adjusting device according to claim 1, further comprising:

a gain reduction detecting part including a low-pass filter for extracting only low frequency components of a predetermined frequency and below from said gain signal, and a subtractor for subtracting said low frequency components from said gain signal and producing the subtraction result as a gain reduction detection signal, wherein said gain reduction recovery part includes:

a flag setting part that, if the level of said gain reduction detection signal is higher than a predetermined gain reduction level, sets a flag to indicate being invalid and, if lower than said gain reduction level, sets the flag to indicate being valid; and a generating part that, only if said envelope level is lower than said reference level and said flag indicates being valid, generates a sequence of gain values where the gain value increases each third period, as said gain signal, said third period being shorter than said first period.

3. An audio signal amplitude adjusting device according to claim 1, further comprising:

a muting part that performs mute processing on said amplitude-adjusted audio signal according to a mute instruction signal, wherein if said envelope level is lower than said noise level, said noise gate part generates a sequence of gain values where the gain value is constant, as said gain signal or supplies said mute instruction signal to said muting part.

4. An audio signal amplitude adjusting device according to claim 2, further comprising:

a muting part that performs mute processing on said amplitude-adjusted audio signal according to a mute instruction signal, wherein if said envelope level is lower than said noise level, said noise gate part generates a sequence of gain values where the gain value is constant, as said gain signal or supplies said mute instruction signal to said muting part.

5. An audio signal amplitude adjusting device according to claim 3, wherein said noise level is a level of white noise.

6. An audio signal amplitude adjusting device according to claim 4, wherein said noise level is a level of white noise.

7. An audio signal amplitude adjusting device according to claim 1, wherein said reference level, said noise level, said minute audio level, and said gain reduction level have a magnitude relation of:

said reference level is greater than said minute audio level which is greater than said noise level.

8. An audio signal amplitude adjusting device according to claim 2, wherein said reference level, said noise level, said minute audio level, and said gain reduction level have a magnitude relation of:

said reference level is greater than said minute audio level which is greater than said noise level.

9. An audio signal amplitude adjusting device according to claim 3, wherein said reference level, said noise level, said minute audio level, and said gain reduction level have a magnitude relation of:

said reference level is greater than said minute audio level which is greater than said noise level.

10. An audio signal amplitude adjusting device according to claim 4, wherein said reference level, said noise level, said minute audio level, and said gain reduction level have a magnitude relation of:

said reference level is greater than said minute audio level which is greater than said noise level.

11. An audio signal amplitude adjusting device according to claim 5, wherein said reference level, said noise level, said minute audio level, and said gain reduction level have a magnitude relation of:

said reference level is greater than said minute audio level which is greater than said noise level.

12. An audio signal amplitude adjusting device according to claim 6, wherein said reference level, said noise level, said minute audio level, and said gain reduction level have a magnitude relation of:

said reference level is greater than said minute audio level which is greater than said noise level.

13. An audio signal amplitude adjusting device according to claim 2, further comprising:

a setting part for externally setting each of said reference level, said noise level, said minute audio level, said gain reduction level, and said first to third periods.

14. An audio signal amplitude adjusting method for adjusting the amplitude of an input audio signal, comprising:

increasing or attenuating the amplitude of said input audio signal according to a gain signal, to provide an amplitude-adjusted audio signal; and generating the gain signal constituted by a series of gain values, based on a result of comparison between an envelope level of said amplitude-adjusted audio signal and a predetermined reference level, said generating the gain signal comprising changing the sequence of the gain values of said gain signal to a sequence of gain values where the gain value increases each predetermined first period, if the sequence of the gain values indicated by said gain signal is not in a decreasing trend or is in the decreasing trend but a decreasing degree is lower than a predetermined gain reduction level, and the envelope level of said amplitude-adjusted audio signal is lower than said predetermined reference level and higher than a predetermined minute audio level, changing the sequence of the gain values of said gain signal to a sequence of gain values where the gain value increases each second period, if the sequence of the gain values indicated by said gain signal is not in the decreasing trend or is in the decreasing trend but the decreasing degree is lower than the predetermined gain reduction level, and said envelope level is lower than said minute audio level and higher than a predetermined noise level, the second period being shorter than said first period, changing the sequence of the gain values of said gain signal to a sequence of gain values where the gain value increases each third period, if the sequence of the gain values indicated by said gain signal is in the decreasing trend and the decreasing degree is higher than the predetermined gain reduction level, and a shift from a state where said envelope level is higher than said predetermined reference level to a state where said envelope level is lower than said predetermined reference level has occurred, the third period being shorter than said first period, and changing the sequence of the gain values of said gain signal to a sequence of gain values where the gain value is constant, if the sequence of the gain values indicated by said gain signal is not in the decreasing trend or is in the decreasing trend but the decreasing degree is lower than the predetermined gain reduction level, and said envelope level is lower than said predetermined noise level.

\* \* \* \* \*